United States Patent [19]
Brown et al.

[11] Patent Number: 4,819,699
[45] Date of Patent: Apr. 11, 1989

[54] CARTRIDGE FEED SYSTEM FOR AUTOMATIC PCB LOADING MACHINE

[75] Inventors: Robert N. Brown, Los Gatos; James J. Farquhar, San Jose, both of Calif.

[73] Assignee: Alliance Automation Systems, Inc., Rochester, N.Y.

[21] Appl. No.: 17,370

[22] Filed: Feb. 24, 1987

[51] Int. Cl.$^4$ .......................... H05K 3/30; B21F 1/00
[52] U.S. Cl. ................................ 140/105; 29/564.1; 29/741; 206/330
[58] Field of Search ............ 140/105; 29/564.1, 564.2, 29/566.1, 566.2, 566.3, 741, 842, 845; 206/330, 409

[56] References Cited

U.S. PATENT DOCUMENTS

| | | | |
|---|---|---|---|
| 3,625,350 | 12/1971 | Ray | 206/330 |
| 4,051,593 | 10/1977 | Mori et al. | 29/741 |
| 4,165,807 | 8/1979 | Yagi | 206/330 |
| 4,174,567 | 11/1979 | Kamoshida et al. | 29/741 |
| 4,205,433 | 6/1980 | Araki et al. | 29/566.2 |
| 4,293,999 | 10/1981 | Woodman, Jr. | 29/566.2 |
| 4,621,406 | 11/1986 | Fujiwara et al. | 29/564.2 |
| 4,631,800 | 12/1986 | Ishii et al. | 29/564.6 |
| 4,711,015 | 12/1987 | Tega et al. | 140/105 |

FOREIGN PATENT DOCUMENTS 0200689  11/1986  European Pat. Off. .............. 29/741

OTHER PUBLICATIONS

Inventor: Ezio Bazzo.

Primary Examiner—Robert L. Spruill
Attorney, Agent, or Firm—Gerald L. Moore; John R. Benefiel; Raymond J. Eifler

[57] ABSTRACT

A part feeder (29) for moving individual parts (34) held on rolls (21) of tape (37) to a pickup point, as for handling by a robot arm (25) inserting parts (34) into PC boards (26) at a work station, the part feeder (29) including a cassette (30) having a housing portion (30a) to hold the roll (21) and side walls (85) having guide members (48,33,104) affixed to position the parts (34) for capture by a parts advancing mechanism (52) to be transferred into a part dressing assembly (43) where the parts (34) have their leads (35,36) straightened and cut to a desired length preparatory to presentation for pickup. (FIG. 7).

7 Claims, 7 Drawing Sheets

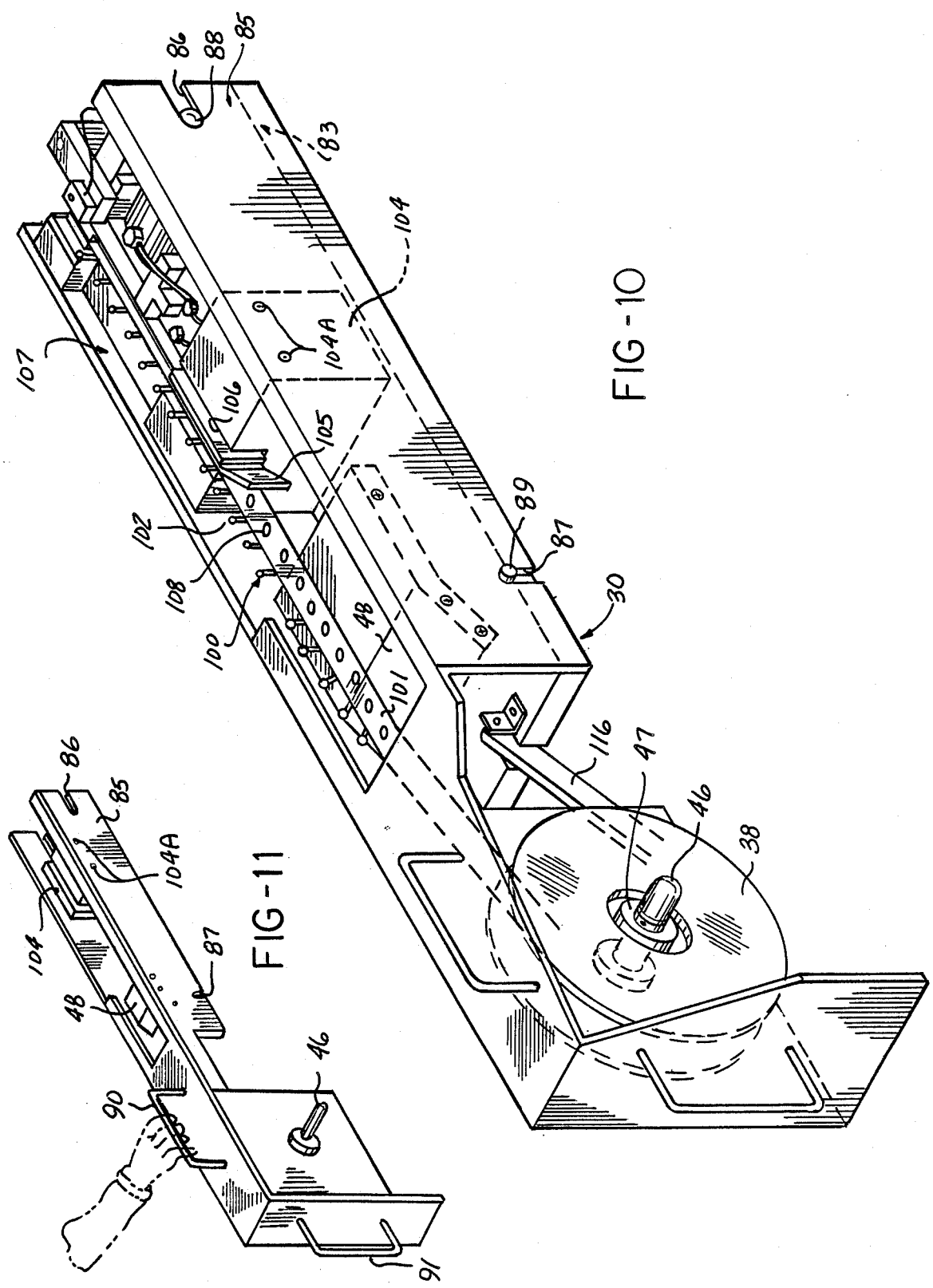

CARTRIDGE FEED SYSTEM FOR AUTOMATIC PCB LOADING MACHINE

CROSS REFERENCES TO RELATED APPLICATIONS

The following applications pertain in general to related subject matter and are assigned to the same assignee:

Application Ser. No. 07/017,366, Mechanical Head for a Robot, inventors, James J. Farquhar and Robert N. Brown, filed on Feb. 24, 1987;

Application Ser. No. 07/017,364, Vertical Parts Feed Mechanism, inventors, James J. Farquhar and Robert N. Brown, filed on Feb. 24, 1987;

Application Ser. No. 07/017,363, Lead Clincher for Printed Circuit Board Loader, inventors, Iggoni S. Fajardo and Robert N. Brown, filed on Feb. 24, 1987;

Application Ser. No. 07/017,367, Conveyor for Printed Circuit Boards, inventors, Robert N. Brown and Walter W. Crofton, filed on Feb. 24, 1987; and Application Ser. No. 06/917,046, Part Feeder, inventors, Robert N. Brown and James J. Farquhar, filed on Oct. 9, 1986.

BACKGROUND OF THE INVENTION

Field of the Invention

A parts feeder for an automatic loader and the like wherein components fixed to a rolled web are presented to the loader in a predetermined attitude for subsequent loading into a printed circuit board.

Description of the Prior Art

It is becoming common practice now to load printed circuit boards with components by use of automatic machinery or robots. In the usual sense these machines translate to feeding stations and pick up components or parts which are then carried to and deposited on the board by inserting the part leads through pre-drilled openings in the board. Thereafter the leads are cut off and can be bent beneath the board to mechanically hold the component in place until soldered.

With the speed and complexity at which the machines now function it is necessary that a plurality of feed stations be located adjacent the loading machine, usually one for each different component to be loaded. The speed at which such machines operate requires that a substantial supply of components be available at all times. Additionally the loading stations should be capable of being reloaded with component web rolls quickly with little or no interruption in the operation of the robot.

Many of the components loaded into printed circuit boards are resistors or capacitors and similar components which have leads. Prior to presentation to the board, the component leads must be cut to a desired length and bent or straightened to be pointed in the direction of movement so they will enter the circuit board holes pre-drilled to receive them. Thus the feed machines must not only present the component in a desired attitude but must also dress the leads in a manner to position and aim them in the proper direction so that they will properly enter the holes in the board or be placed onto the board surface.

One additional characteristic of an ideal loading station is the ability either to allow interchange of parts rapidly and to allow easy adjustment such that each feeder can be calibrated to handle components of varying sizes and shapes. It is also preferable that a single feed machine be capable of quick adjustment for handling all components within a size variation that are presented in the same attitude.

SUMMARY OF THE INVENTION

A loading station for presenting components to an automatic board loader including a base for attachment to the automatic machine, a cassette capable of attachment to the base and including a mount for receiving a tape roll on which the components are fixed in spaced alignment and spaced side walls mounting guide members receiving tape unwound from the roll to position the components for capture by a dressing assembly. The dressing assembly includes, a rachet for advancing the parts, as by driving of the tape a predetermined incremental distance with each actuation for moving the tape forward in a plane suitable for presentation to the loader, and a lead dressing assembly for aligning the leads in a pre-determined direction and cutting the leads to a suitable length such that they will fit into the board holes or onto the board surface.

DESCRIPTION OF THE DRAWINGS

FIG. 10 is an enlarged view of the feeder station shown in FIGS. 8 and 9 with the cassette in place; and FIG. 11 is a reduced size view of the cassette.

PREFERRED EMBODIMENT OF THE INVENTION

Figure 1:
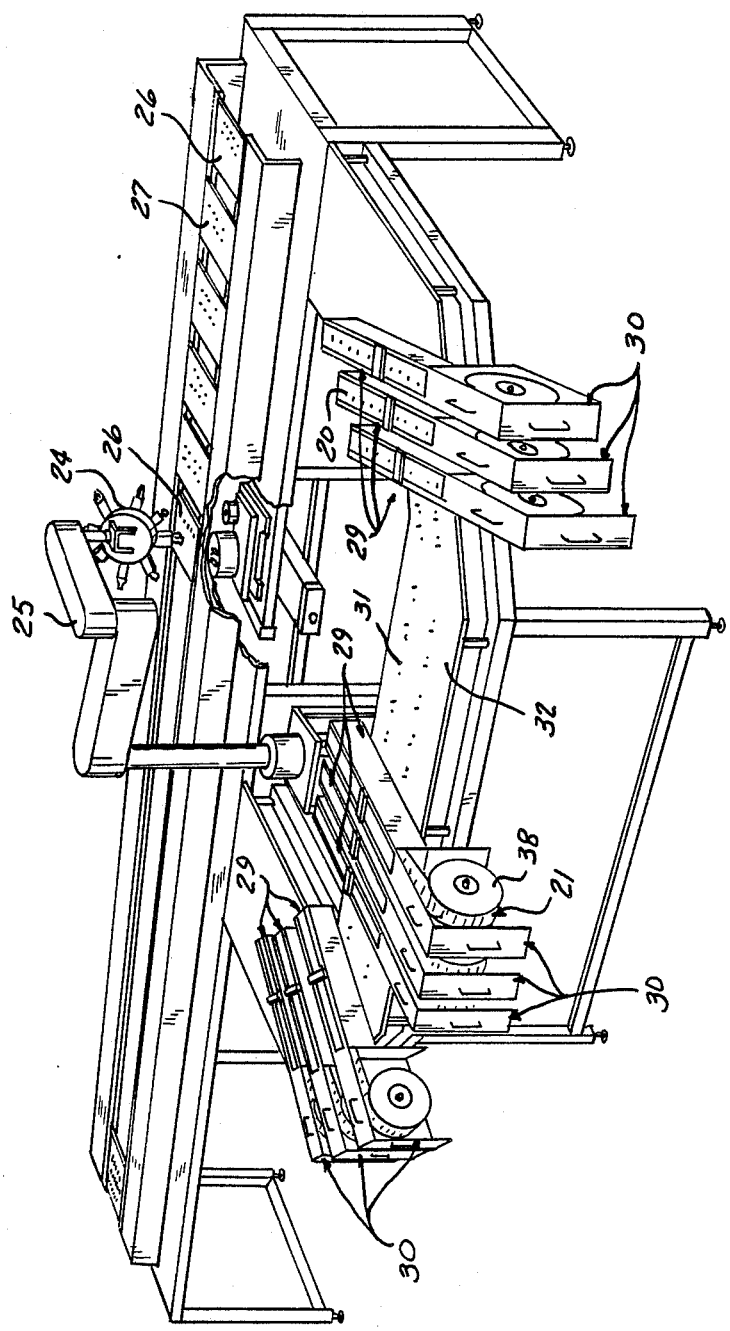
FIG. 1 is a perspective view of a typical robotic loading station employing the subject invention.

In FIG. 1 is shown a part loading station for loading parts 20 presented on a roll 21 to a gripper head 24 mounted on a servo-controlled actuator 25 for movement between a plurality of circuit boards 26, each having holes 27 therein for receiving the parts. The parts are presented by part feeders 29 positioned on lugs 31 on a table 32 arranged within reach of the actuator 25. Each part comprises an electronic component 34 (FIG. 2) to which is usually attached at least two conductors or leads 35 and 36 fixed to one or more tapes 37. The tape rolls are on reels 38 for easy transport. The feeder functions to present these parts to the loader in a form suitable for insertion of the leads 35, 36 into preselected holes 27 in the circuit boards with the leads 35, 36 properly aligned, cut to size and dressed for fitting into the holes 27. Thereafter, the circuit boards are passed through a wave solderer (not shown) for attachment of the parts to the board 26 with electrical contact between the printed circuits and the leads. As each board 26 is loaded, a pair of the chains (not shown) are driven by a motor (also not shown) to advance the loaded board 26 and bring into loading position a new board 26 for loading.

Figure 2:
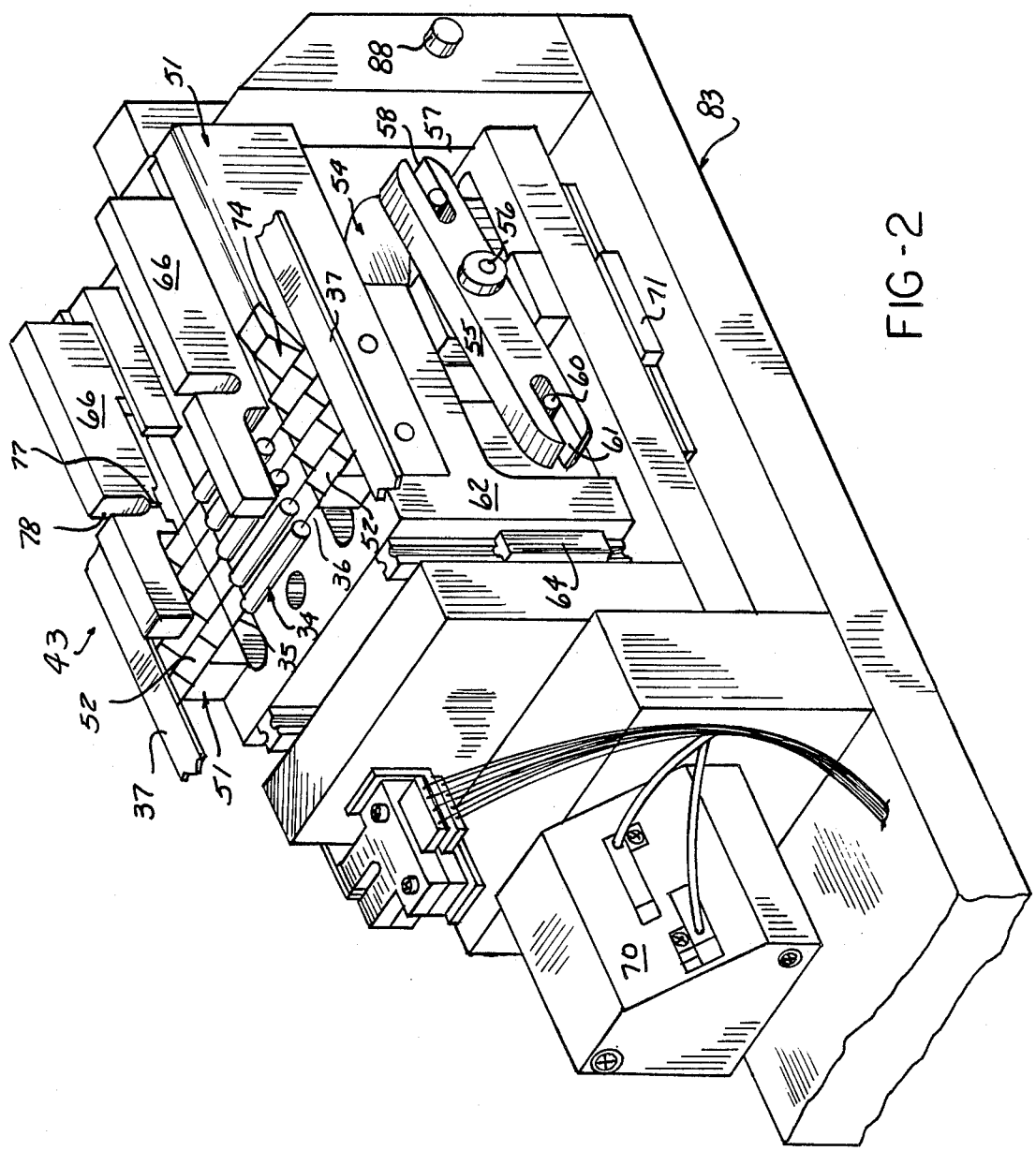
FIG. 2 is an enlarged perspective view of the component advance and dressing station.
Figure 7:
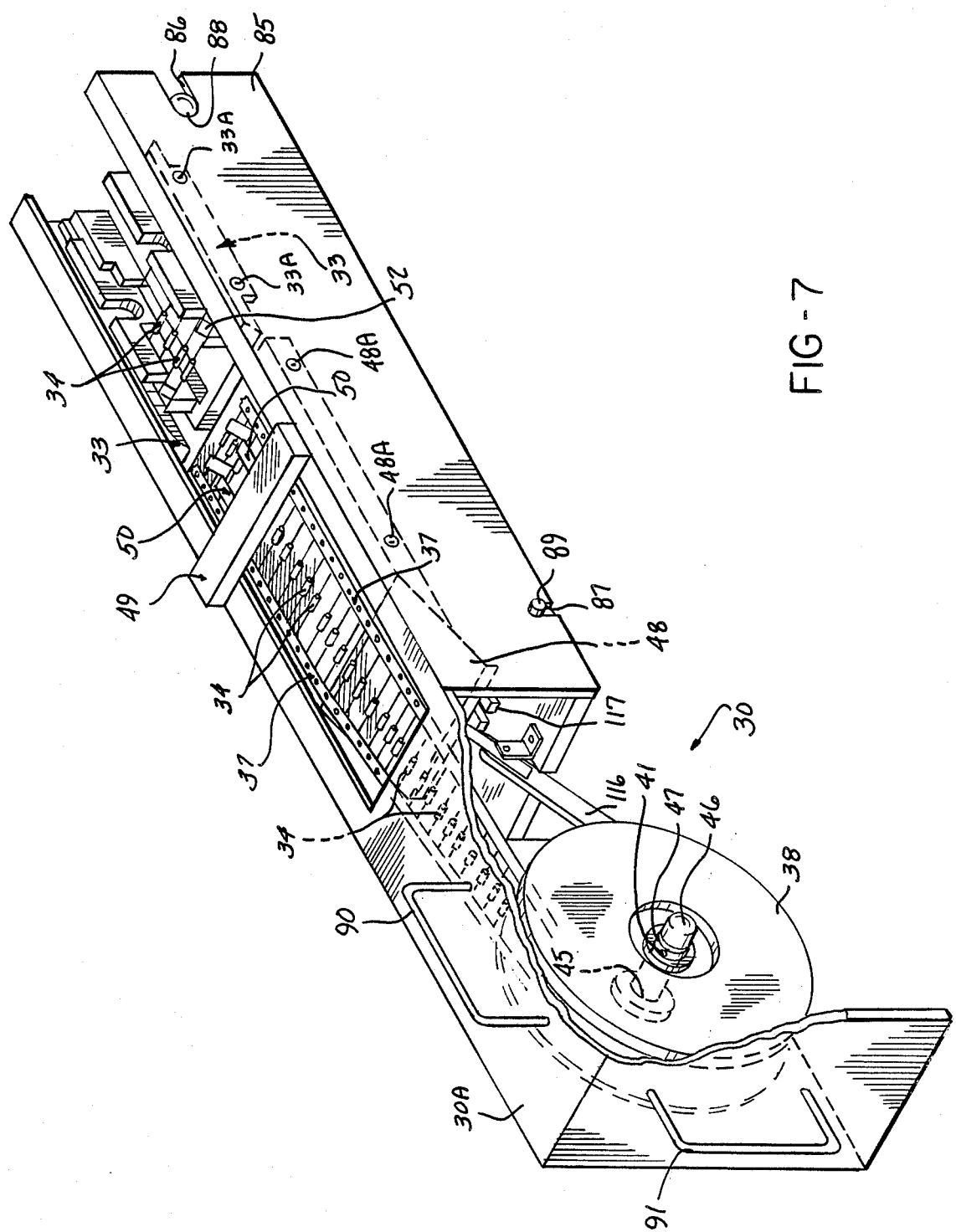
FIG. 7 is an enlarged perspective view of a feeder station such as those shown in FIG. 1.
Figure 8:
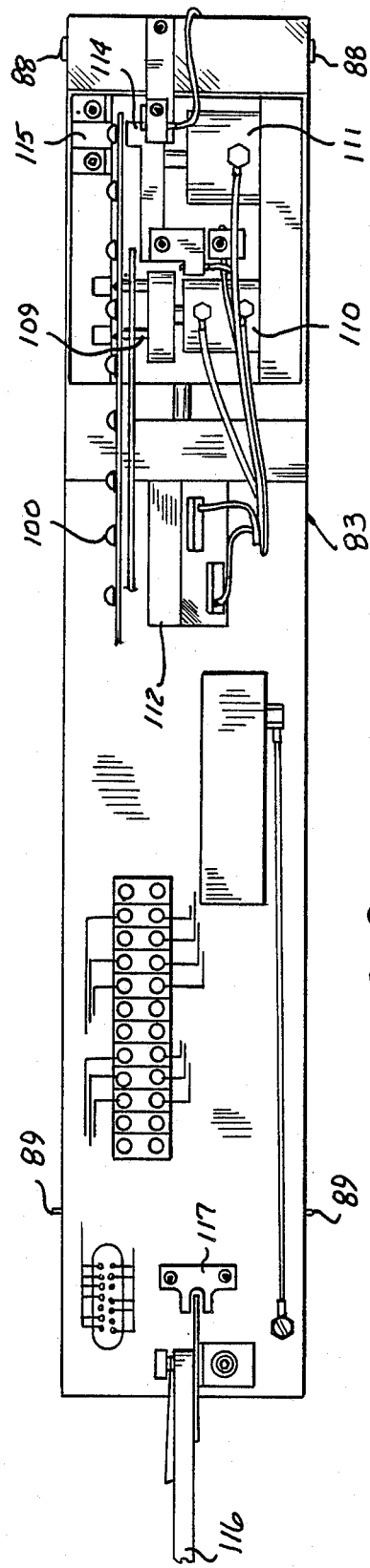
FIGS. 8 and 9 are top and side views of a second type of feeder station with the cassette removed.
Figure 9:
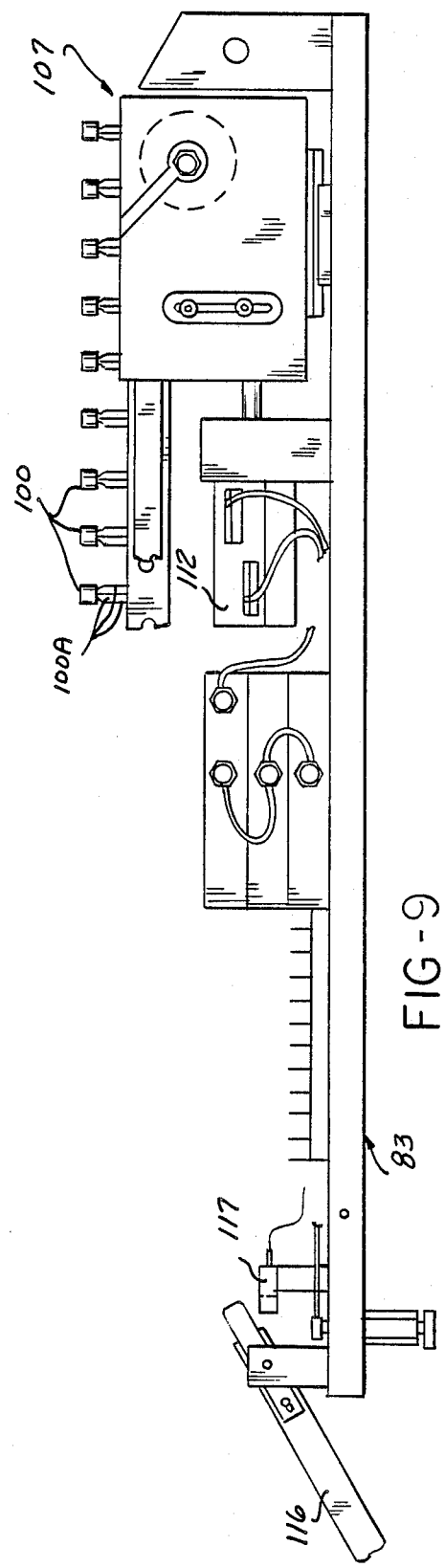

A first embodiment of the parts feeder 29 is shown primarily in FIGS. 2 through 7. As best seen in FIG. 7, each part feeder 29 includes a cassette 30 which in turn includes an open sided housing portion 30a which mounts a roll 21 of tapes 37 holding parts 34 which must be presented one at a time to the gripper 24 for placement into the printed circuit boards 26. For this purpose the reel 38 includes a center hole 45 which fits over a stationary shaft 46 extending towards the open side of housing 30a. Thereafter a lock 47 having a set screw 41, is placed on the shaft 46 to hold the reel 38 in place. The tapes 37 are dispensed from the roll 21 in a horizontal direction to pass across a ramp 48 and beneath a stop plate 49 having fixed thereto a pair of spring stops 50. The cassette 30 has a pair of side walls 85 extending away from housing portion 30a. The side walls 85 have fixed thereto the ramp 48 by means of fasteners 48a. The tapes 37 thereafter extend atop spaced apart guide plates 33 fixed to the side walls 85 with fasteners 33a straddling a dressing station assembly 43 the details of the dressing station 43 are best seen in FIG. 2, comprising a pair of holding plates 51 each having a top surface serrated to form a plurality of V-shaped troughs 52 positioned to receive the leads 35, 36 of the components 34. The components 34, having been prepositioned in the cassette 30 advanced by payout of the tapes 37 from roll 21, ride between these holding plates 51 which are fixed to a vertically positioned actuator 54 so as to move up and down a distance slightly greater than the depth of the troughs 52.

Figure 3:
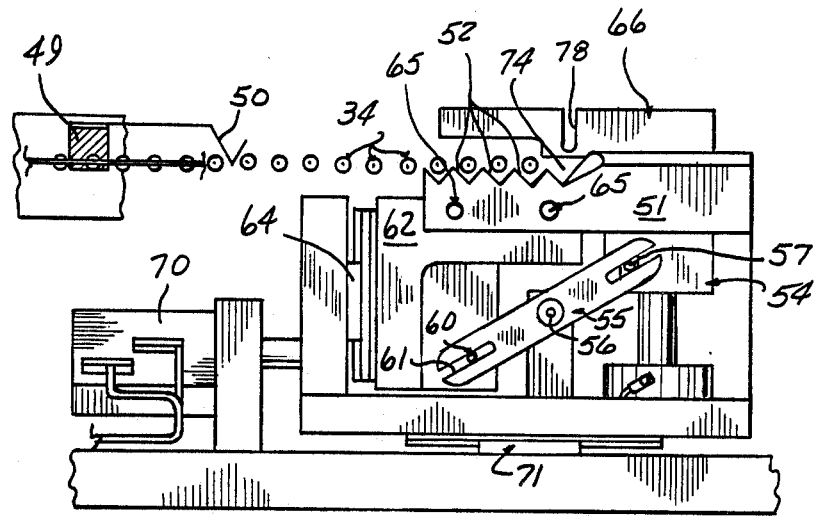
FIGS. 3, 4, 5 and 6 show the station of FIG. 2 in side view being actuated through the various stages for advancing and dressing components.
Figure 4:
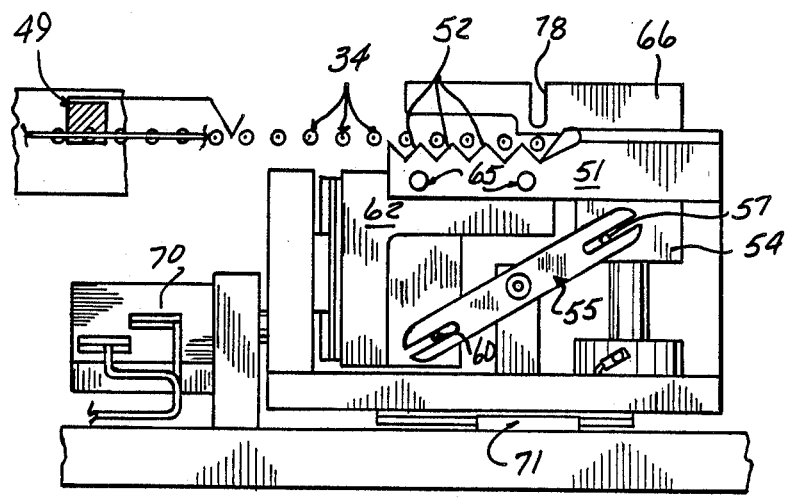
Figure 5:
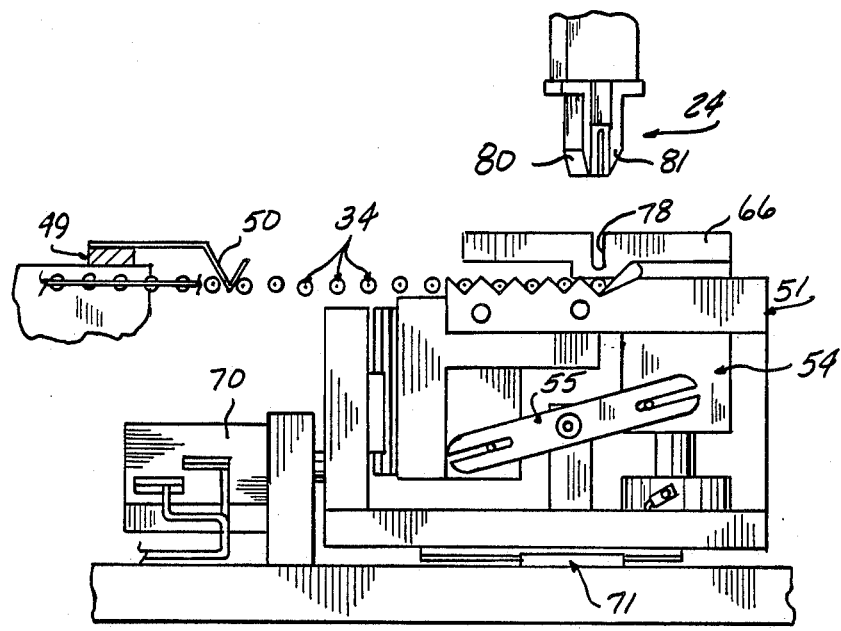
Figure 6:
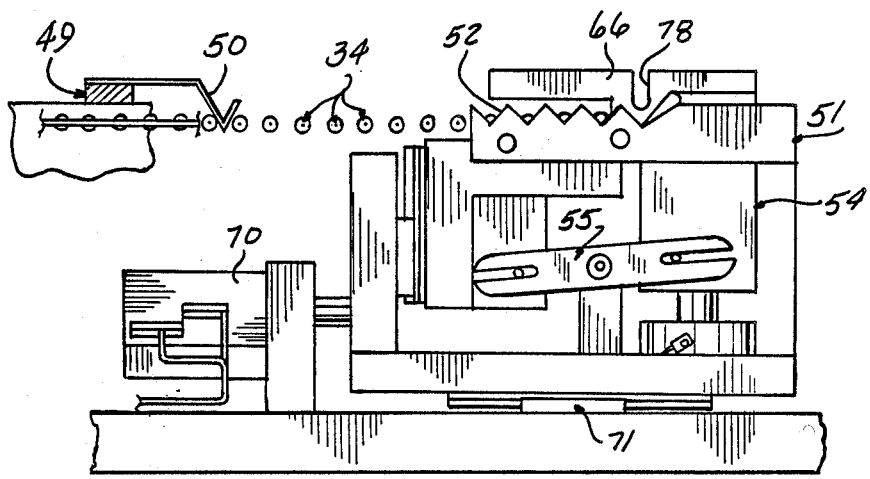

The overall purpose of the dressing assembly 43 is to present the components 34, one at a time, in an attitude that can be contacted by the gripper 24 and with the leads 35, 36 trimmed and aligned to fit in the predrilled holes 27 and the circuit boards 26. Thus as shown in FIG. 3, the dressing operation is initiated by energization of the actuator 54 to move upward, thereby swinging the lever arm 55 about a support pin 56 in the counterclockwise direction carrying with it a pin 57 in the slot 58. Rotation of the lever arm 55 also moves a pin 60 riding in the slot 61 in the opposite end of the arm downward, carrying with it the mounting assembly 62 which rides between ways 64. The holding plates 51 fixed to the support assembly 62 by pins 65 thus are pulled downward while a cutting and forming shoe 66 adjacent each of the holding plates 51 is moved upward because it is fixed to the actuator 54. Immediately a second actuator 70 is energized thereby moving the entire dressing assembly 43 along supporting ways 71 from right to left, or from the position shown in FIG. 3 to the position shown in FIG. 4, to thus align each component 34 with the next trough 52. Thereafter the actuator 54 is energized to lower the shoes 66 slightly and raise the support assembly 62 causing the leads 35, 36 to fit within the next adjacent trough 52 while the actuator 70 is once again energized to move the dressing assembly 43 and the captured components 34 from left to right in the drawing thereby shifting this dressing assembly 43 and captured components 34 a distance equal to the spacing between the components 34 fixed to the tapes 37.

In this manner the components 34 are advanced from the roll 21 one at a time to the cutting die 74, and with further actuation of the shoes 66 downward, the leads 35, 36 are cut and at the same time are bent around the edge 76 (FIG. 2) of the support assembly 62 so as to extend at right angles for proper fitting into the preselected holes 27 of the circuit board 26. While the dressing assembly 43 is holding a component 34 in this position, with the leads 35, 36 fitting within a slot 77 in each shoe 66, guide slots 78 serve to assure alignment of the gripper head 24 for the lowering of the gripper arms 80 and 81 between the shoes 66 to grasp the component 34 and lift it there from. Naturally, sensors (not shown) are positioned in various places about the dressing assembly 43 to sense the presence of the parts and assure proper sequencing of the apparatus.

The cassette 30 is designed to allow quick and easy replacement of a roll of parts when necessary. As shown in FIG. 7, the cassette includes two side walls 85 each having slots 86 and 87 which interfit with pins 88 and 89, respectively, fixed in the frame 83 of the dressing assembly 43 to removably hold the cassette 30 in place on the part feeder. Thus, by merely grasping the handles 90 and 91 and pivoting the cassette about the pin 88 until the slot 87 clears the pin 89 and thereafter pulling horizontally to clear the slot 86 from the pin 88, the cassette is free for replacement with a full cassette when the parts have been dispensed.

In FIGS. 8 through 11 is a second embodiment of the invention for presenting parts 100 positioned vertically instead of horizontally as described in the previous embodiment. Herein the cassette 30 is identical to that previously described and comprises the side walls 85, the recesses 86 and 87 for interfitting with the pins 88 and 89, respectively, and the shaft 46 with locking member 47 for holding a parts reel 38 holding the roll 21 thereon. In this embodiment the tape 101 generally is positioned to one side of the part 100 and adheres to all of the leads 100a extending in one direction from the component 102. As the tape rides across the ramp 48 it is forced to a vertical position by a fender 105 for passage through a groove 106 in a guide block 104 fixed to the side walls 85 of the cassette 30 with fasteners 104a. For advancing the parts, the tape 101 includes spaced holes 108 positioned between the parts and engaged by a pair of pins 109 extending horizontally from an actuator 110. The dressing assembly 107 includes a primary actuator 111 and a secondary actuator 112. The primary actuator 111 is actuated downward to pull therewith a shoe 114 out of engagement with the parts 100 while the actuator 110 is energized to disengage the pins 109 from the tape 101. Thereafter an actuator 112 pulls the dressing assembly 107 toward the cassette 30 the distance of one spacing between the holes 108. The actuator 110 then is energized to engage the pins 109 into the aligned tape holes 108 and by causing actuator 112 to move the dressing assembly 107 in a direction away from the cassette, the tape 101 is advanced one component to move the captured lead component 100 into engagement with a die 115. Thereafter by energization of the primary actuator 111, the shoe is caused to engage the leads of the component 100 and force them against the die 115 thereby aligning the leads and severing the bottoms to the desired length. The loader head 24 is then energized to bring the arms 80 and 81 into position to pick up the component and move it to the desired position on a circuit board. A spring loaded arm 116 is biased against the roll 21 and when the reel is empty, this arm is permitted to pivot sufficiently to contact and actuate a switch 117 to signal the presence of an empty reel.

I claim:

1. A part feeder (29) for moving individual parts (34,100) from a roll (21) containing a plurality of parts (34,100) formed of a component plus leads (35,36,100a) and joined by at least one tape (37,101) said parts (34,100) secured to said at least one tape (37,101) at a spaced distance therebetween, said parts (34,100) positioned by said part feeder (29) to be picked up and thereafter moved to a work station for insertion of a portion (35,36,100a) of the part (34,100) into a receiving opening (27) in a workpiece (26), said part feeder (29) comprising:

a table (32) adapted to support at least one part feeder (29), a cassette (30) adapted to be detachably secured to said table (32) including a housing portion (30a) and a single reel (38) received in said housing portion (30a), means rotatably holding the reel to allow a tape roll (21) placed on the reel (38) to unroll and present the parts (34,100) in single file order;

said cassette (30) further including walls (85) extending away from said housing portion (30a);

guide means (48,33,104) affixed to said cassette walls (85) comprising means for prepositioning the at least one tape (37) and attached parts (34,100) unwound from said roll (21);

a dressing assembly (43,107) separate from said cassette including a frame (83) fixed to said table (32), and readily releasable securement means (85,86,88,89) for readily releasably securing said cassette (30) with respect tos aid frame (83);

said dressing assembly (43,107) including parts advancing means (51,52,54,70,109,110,112) at least partially enclosed by said cassette walls to align said guide means (48,33,104) with said parts advancing means so as to capture parts (34,100) prepositioned by said guide means (48,33,104) with said parts advancing means and advance said parts (34,100) one at a time from said guide means, and dressing said part leads (35,36,100a) by straightening and aligning the part leads (35,36,100a) preparatory to pickup.

2. A part feeder (29) as defined in claim 1, wherein said cassette (30) includes at least one handle (90,91) for easy carrying.

3. A part feeder (29) as defined in claim 2, wherein said guide means aligns said parts (100) in a vertical orientation for presentation to said dressing assembly (107) and preparatory to pickup after dressing of said part leads (35,36,100a).

4. A part feeder as defined in claim 2, wherein said guide means aligns said parts (34) in a horizontal orientation for presentation to said dressing assembly and preparatory to pickup after dressing said part leads (35,36,100a).

5. The part feeder (29) according to claim 1 further including cutting means (74,114) for cutting said part leads (35,36,100a) to length and thereby separating said parts (34,100) from said at least one tape (37,101) preparatory to dressing thereof.

6. The part feeder (29) according to claim 5 wherein said cutting means (74,114) is included in said dressing assembly (43,107), and wherein said part advancing means (51,52,70,109,119) engages said at least one tape (37,101) to advance said parts (34,100) into said dressing assembly (43,107).

7. A part feeder (29) as defined in claim 4, wherein said parts advancing means (51,52,54,70,109,110,112) comprises engagement means (52,109) adjacent said cassette for releasably engaging a portion of said at least one tape (37,101) positioned by said cassette guide means, and a first actuator means (70,112) for moving said dressing assembly (43,107) from a first position toward said tape roll (21) on said cassette (30) the distance equal to the spacing between the parts (34,100), a second actuator means (54,110) for actuating said engagement means to engage said at least one tape (37,101), said first actuator means thereafter moving said dressing assembly (43,107) back to said first position while said second actuator means causes said engagement means to be disengaged from said at least one tape (37,101) to thereby advance said at least one tape (37,101) the distance of the space between the parts to be disengaged from said at least one tape (37,101) to thereby advance said at least one tape (37, 101) the distance of the space between parts (34,100) to move another part (34,100) into said dressing assembly (43,107).

* * * * *